United States Patent
Ishii

[11] Patent Number: 6,100,591
[45] Date of Patent: Aug. 8, 2000

[54] SEMICONDUCTOR DEVICE AND METHOD OF FABRICATING THE SAME

[75] Inventor: Koji Ishii, Tokyo, Japan

[73] Assignee: NEC Corporation, Japan

[21] Appl. No.: 09/314,582

[22] Filed: May 18, 1999

[30] Foreign Application Priority Data

May 25, 1998 [JP] Japan .................................. 10-142456

[51] Int. Cl.[7] ........................... H01L 23/48; H01L 23/52; H01L 29/40
[52] U.S. Cl. ......................... 257/773; 257/774; 257/750; 257/758; 438/622; 438/629
[58] Field of Search ................... 257/773, 774, 257/750, 758; 438/622, 629

[56] References Cited

U.S. PATENT DOCUMENTS

| | | | |
|---|---|---|---|
| 5,502,337 | 3/1996 | Nozaki | 257/773 |
| 5,739,587 | 4/1998 | Sato | 257/758 |

FOREIGN PATENT DOCUMENTS

| | | | |
|---|---|---|---|
| 59-47755 | 3/1984 | Japan | H01L 27/04 |
| 555459 | 3/1993 | Japan | H01L 27/04 |

*Primary Examiner*—David Hardy
*Assistant Examiner*—Jhihan B Clark
*Attorney, Agent, or Firm*—Hayes, Soloway, Hennessey, Grossman & Hage, P.C.

[57] ABSTRACT

There is provided a semiconductor device including a substrate, a first insulating film formed on the substrate, a first electrically conductive layer formed on the first insulating film, a dielectric layer formed on the first electrically conductive layer, the dielectric layer being formed with a first through-hole, a second electrically conductive layer formed on the dielectric layer, the second electrically conductive layer being formed with a second through-hole in alignment with the first through-hole, a second insulating film covering the first and second electrically conductive layers therewith, and a first wiring layer formed on the second insulating film, a first contact hole being formed through the second insulating film, and the dielectric layer and the second electrically conductive layer both in the first and second through-holes, the first wiring layer making electrical contact with the first electrically conductive layer through the first contact hole. The semiconductor device effectively reduces parasitic resistance of the first electrically conductive layer without an increase in an area of the first electrically conductive layer.

24 Claims, 5 Drawing Sheets

SEMICONDUCTOR DEVICE AND METHOD OF FABRICATING THE SAME

BACKGROUND OF THE INVENTION

1. Field of the Invention

The invention relates to a semiconductor device and a method of fabricating the same, and more particularly to a semiconductor device including an electrode composed of electrically conductive material and a capacity device comprised of a dielectric film, and a method of fabricating the same.

2. Description of the Related Art

Figure 1A:
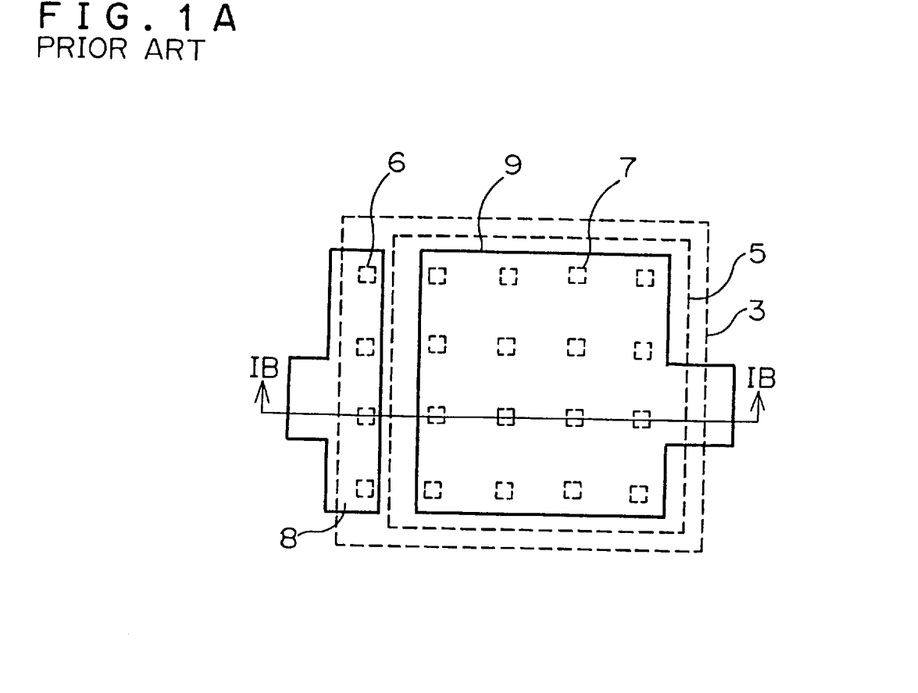
FIG. 1A is a plane view of a conventional semiconductor device.
Figure 1B:
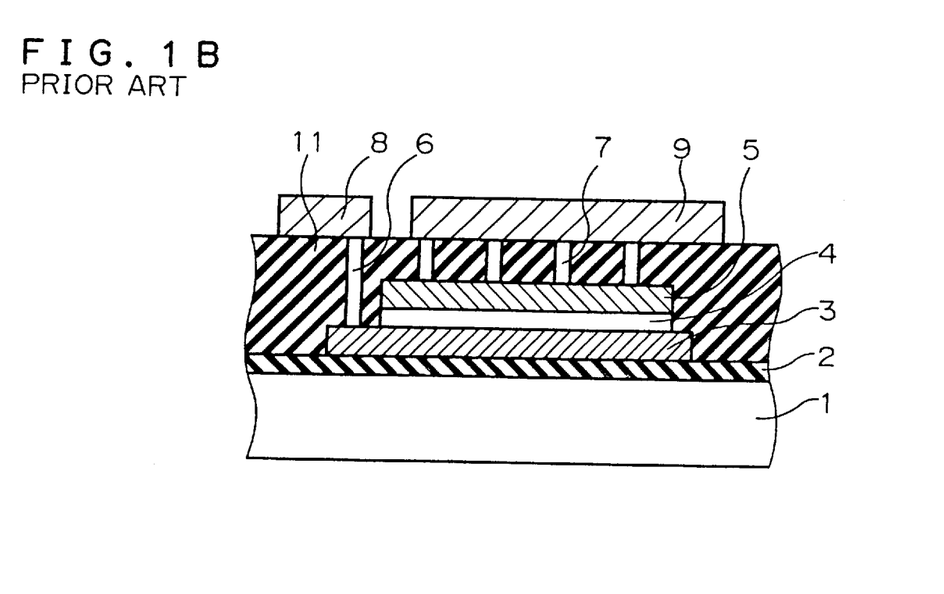
FIG. 1B is a cross-sectional view taken along the line IB—IB in FIG. 1A.

There have been suggested so far various semiconductor devices including a capacity device. FIGS. 1A and 1B illustrate an example of such semiconductor devices. FIG. 1A is a plan view of one of conventional semiconductor devices, and FIG. 1B is a cross-sectional view taken along the line of IB—IB in FIG. 1A.

The illustrated semiconductor device is comprised of a semiconductor substrate 1, a first insulating layer 2 formed on the semiconductor substrate 1, a lower electrode 3 formed on the first insulating layer 2 and composed of first electrically conductive material, a dielectric film 4 formed on the lower electrode 3, an upper electrode 5 formed on the dielectric film 4 and composed of second electrically conductive material, a second insulating film 11 entirely covering the first insulating layer 2, the lower electrode 3, the dielectric film 4, and the upper electrode 5 therewith, a first wiring layer 8 making electrical contact with the lower electrode 3, and a second wiring layer 9 making electrical contact with the upper electrode 5.

The lower electrode 3 makes electrical contact with the first wiring layer 8 through a first contact hole 6 formed throughout the second insulating film 11, and the upper electrode 5 makes electrical contact with the second wiring layer 9 through a second contact hole 7 formed throughout the second insulating film 11.

The lower and upper electrodes 3 and 5 are composed of polysilicon films containing impurities such as arsenic and boron at about $1 \times 10^{20}$ cm$^{-3}$ and having a thickness in the range of about 150 to 300 nm. The lower and upper electrodes 3 and 5 have a sheet resistance in the range of 50 to 100 Ω per a unit area.

If the dielectric film 4 is composed of a silicon dioxide film having a thickness in the range of about 10 to 40 nm, and the upper electrode 5 is formed in a 20 $\mu$m×20 $\mu$m square, an area over which the lower and upper electrodes 3 and 5 overlap each other is 400 $\mu$m$^2$, and a capacity provided by the lower and upper electrodes 3 and 5 is in the range of about 0.3 to 1.2 pF.

The lower and upper electrodes 3 and 5 may be constituted of a film composed of tungsten silicide which is a compound of tungsten (W) and silicon (Si).

The semiconductor device having the above-mentioned structure has a capacity defined by an area over which the dielectric film 4, the lower electrode 3 and the upper electrode 5 overlap one another.

As the semiconductor device operates at a higher frequency, parasitic resistance of the lower and upper electrodes 3 and 5 would influence operation of the semiconductor device to a greater degree, resulting in that a capacity of the semiconductor device is varied due to a frequency.

Hence, it is quite important for a semiconductor device to reduce parasitic resistance of the lower and upper electrodes 3 and 5 in order to enhance performance of the semiconductor device.

A parasitic resistance of the upper electrode 5 is reduced generally as follows.

The second wiring layer 9 and the second contact hole 7 may be formed on the second insulating film 11, unless they are located above the upper electrode 5. Hence, as illustrated in FIG. 1A, it is possible to reduce a parasitic resistance of the upper electrode 5 by forming a plurality of the second contact holes 7 above the upper electrode 5, and electrically connecting the upper electrode 5 to the second wiring layer 9 through the second contact holes 7.

On the other hand, the lower electrode 3 is made in electrical contact with the first wiring layer 8.

As is obvious in view of FIG. 1B, it is not possible to form the first contact hole 6 between the first wiring layer 8 and the lower electrode 3 at a location where the upper electrode 5 exists. Hence, the first contact hole 6 is formed only outside the upper electrode 5.

When a parasitic resistance of the lower electrode 3 exerts only a small influence on the operation of a semiconductor device, a plurality of the first contact holes 6 are formed in a line outside and along a side of the upper electrode 5, as illustrated in FIG. 1A.

There have been suggested various structures for reducing a parasitic resistance of the lower electrode 5. For instance, one of such structures is suggested in Japanese Unexamined Patent Publication No. 59-47755.

Figure 2A:
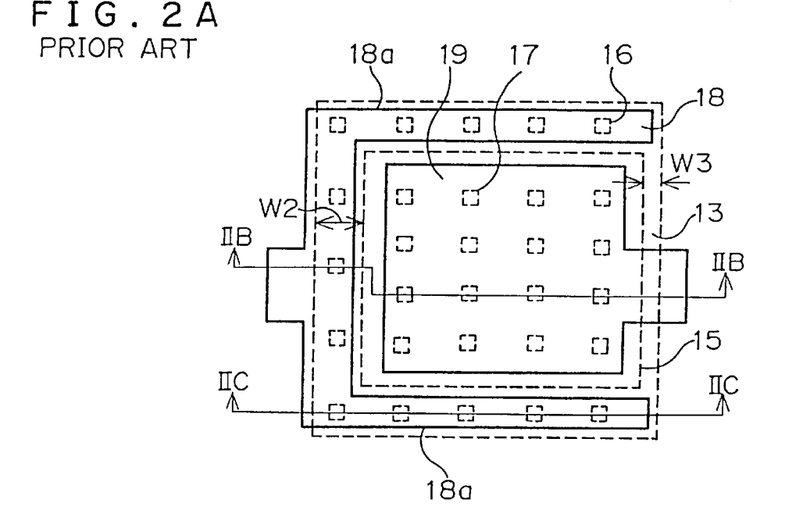
FIG. 2A is a plan view of another conventional semiconductor device.
Figure 2B:
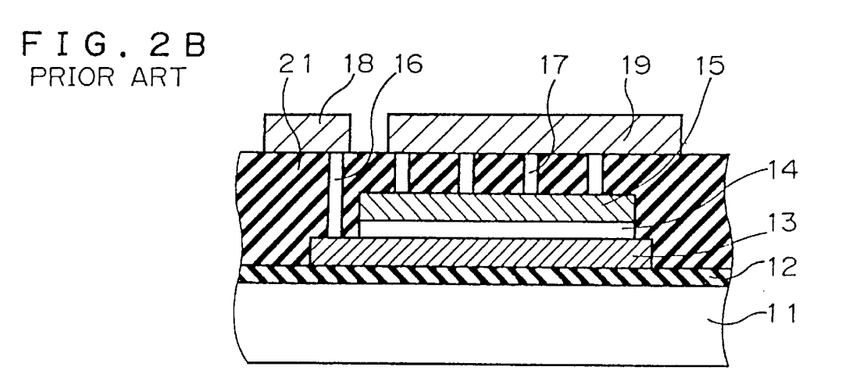
FIG. 2B is a cross-sectional view taken along the line IIB—IIB in FIG. 2A.
Figure 2C:
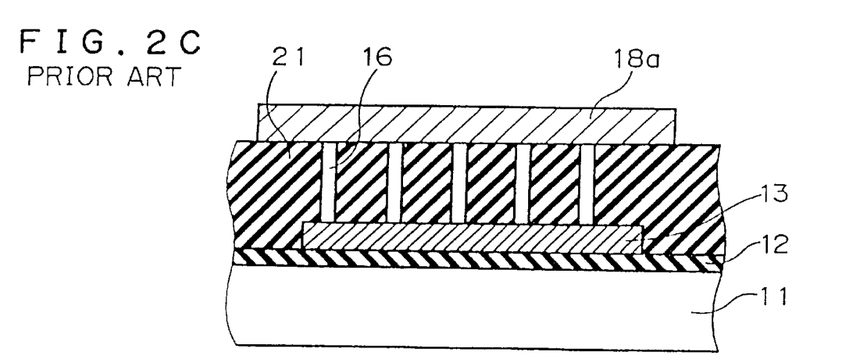
FIG. 2C is a cross-sectional view taken along the line IIIB—IIIB in FIG. 2A.

FIGS. 2A, 2B and 2C illustrate a semiconductor device suggested in the above-mentioned Publication. FIG. 2A is a plan view of the semiconductor device, FIG. 2B is a cross-sectional view taken along the line IIB—IIB in FIG. 2A, and FIG. 2C is a cross-sectional view taken along the line IIIB—IIIB in FIG. 2C.

As illustrated in FIGS. 2B and 2C, the semiconductor device is comprised of a semiconductor substrate 11, a first insulating layer 12 formed on the semiconductor substrate 11, a lower electrode 13 formed on the first insulating layer 12 and composed of first electrically conductive material, a dielectric film 14 formed on the lower electrode 13, an upper electrode 15 formed on the dielectric film 14 and composed of second electrically conductive material, a second insulating film 21 entirely covering the first insulating layer 12, the lower electrode 13, the dielectric film 14, and the upper electrode 15 therewith, a first wiring layer 18 making electrical contact with the lower electrode 13, and a second wiring layer 19 making electrical contact with the upper electrode 15.

The lower electrode 13 makes electrical contact with the first wiring layer 18 through a first contact hole 16 formed throughout the second insulating film 21, and the upper electrode 15 makes electrical contact with the second wiring layer 19 through a second contact hole 17 formed throughout the second insulating film 21.

As illustrated in FIG. 2A, the lower electrode 13 is formed to extend outwardly from the upper electrode 15 at three sides, and the first wiring layer 18 is formed to have two extensions 18a extending in parallel with the second wiring layer 19. As a result, the first wiring layer 18 having the two extensions 18a surround the second wiring layer 19 at three sides thereof The first contact holes 16 are formed also between the lower electrode 13 and the extensions 18a.

Thus, the first contact holes 16 are positioned along three sides of the second wiring layer 19. The lower electrode 13 outwardly extends from the upper electrode 15 by a length of 3 $\mu$m indicated as W2 along the three sides of the second wiring layer 19, and by a length of 1 $\mu$m indicated as W3 along a remaining side of the second wiring layer 19.

If it is supposed that the upper electrode 15 is a 20 $\mu$m×20 $\mu$m square, a dimension of a capacity is determined in accordance with a dimension of the lower electrode 13. In the semiconductor device illustrated in FIGS. 2A to 2C, the capacity is a rectangle having a longer side which is 26 $\mu$m long and a shorter side which is 24 $\mu$m long, and hence, has an area of 624 $\mu$m$^2$. An area over which the lower and upper electrodes 13 and 15 overlap each other is 400 $\mu$m$^2$, and the capacity would be in the range of abut 0.3 to 1.2 pF.

If an area over which the lower and upper electrodes 13 and 15 overlap each other is made larger with the area being kept to be a square or a rectangle having a longer side and a shorter side almost equal in length to the longer side, a parasitic resistance would be significantly increased. In such a case, the lower electrode has to be formed to be a rectangle having a great ratio in length between longer and shorter sides, even though an area of the lower electrode is kept unchanged. This results in restriction in determination of a shape of the capacity.

As mentioned so far, a conventional capacity is accompanied with a problem that it is quite difficult to reduce a parasitic resistance of a lower electrode, which is hindrance to operation of a semiconductor device at high frequency.

In particular, an area over which lower and upper electrodes overlap each other has to be formed large for obtaining a high capacity. As a result, a length between the first contact hole 6 and a center of a capacity cannot avoid being long, which will cause problems that the lower electrode 3 is unavoidable to be large in size, and a parasitic resistance thereof is also unavoidable to be high.

In order to reduce a parasitic resistance of the lower electrode, there may be arranged a plurality of capacities each having a small capacitive value, to thereby construct a capacity having a desired high capacitive value. However, a resultant capacity cannot avoid being large in an area, resulting in that a semiconductor device including such a capacity cannot avoid being large in size.

For instance, Japanese Unexamined Patent Publication 5-55459 has suggested a semiconductor integrated circuit device including a plurality of octagonal lower electrodes. However, it is necessary to carry out the greater number of steps in order to form an octagonal lower electrode than the number of steps of a method of forming a square or rectangular electrode.

SUMMARY OF THE INVENTION

In view of the above-mentioned problems of the prior art, it is an object of the present invention to provide a semiconductor device having such a structure that a parasitic resistance of a lower electrode can be effectively reduced without an increase in an area of a lower electrode.

It is also an object of the present invention to provide a method of fabricating such a semiconductor device.

In one aspect, there is provided a semiconductor device including (a) a substrate, (b) a first insulating film formed on the substrate, (c) a first electrically conductive layer formed on the first insulating film, (d) a dielectric layer formed on the first electrically conductive layer, the dielectric layer being formed with a first through-hole, (e) a second electrically conductive layer formed on the dielectric layer, the second electrically conductive layer being formed with a second through-hole in alignment with the first through-hole, (f) a second insulating film covering the first and second electrically conductive layers therewith, and (g) a first wiring layer formed on the second insulating film, a first contact hole being formed through the second insulating film, and the dielectric layer and the second electrically conductive layer both in the first and second through-holes, the first wiring layer making electrical contact with the first electrically conductive layer through the first contact hole.

It is preferable that the semiconductor device further includes a second wiring layer formed on the second insulating film, the second wiring layer making electrical contact with the second electrically conductive layer through a second contact hole formed through the second insulating film.

It is preferable that the first and second electrically conductive layers have the same plane shape. As an alternative, the second electrically conductive layer may be smaller in plane shape than the first electrically conductive layer.

It is preferable that the first wiring layer making electrical contact with the first electrically conductive layer further through a third contact hole formed through the second insulating film outside the second electrically conductive layer.

It is preferable that the first and second wiring layers are in the form of a comb, and are arranged in such a manner that combs of the first and second wiring layers are in mesh with each other.

As an alternative, the first and second wiring layers may be formed in zigzag.

It is preferable that the second insulating film has a thickness in the range of 500 to 1000 nm above the second electrically conductive layer.

It is preferable that the first and second through-holes have a common diameter.

It is preferable that the first and second through-holes have an inner wall spaced away from the first contact hole by about 0.5 $\mu$m.

In another aspect of the present invention, there is provided a method of fabricating a semiconductor device, including the steps of (a) forming a first insulating film formed on a substrate, (b) forming a first electrically conductive layer formed on the first insulating film, (c) forming a dielectric layer formed on the first electrically conductive layer, (d) forming a second electrically conductive layer formed on the dielectric layer, (e) forming a through-hole throughout both the second electrically conductive layer and the dielectric layer, (f) forming a second insulating film covering therewith a product resulting from the step (e), (g) forming a first contact hole through the second insulating film, and the dielectric layer and the second electrically conductive layer both in the through-hole, to reach the first electrically conductive layer, (h) filling the first contact hole with metal, and (i) forming a first wiring layer on the second insulating film in such a manner that the first wiring layer makes electrical contact with the first electrically conductive layer through the first contact hole.

It is preferable that the method further includes the steps of (j) forming a second contact hole through the second insulating film to reach the second electrically conductive layer, (k) filling the second contact hole with metal, and (l) forming a second wiring layer on the second insulating film in such a manner that the second wiring layer makes electrical contact with the second electrically conductive layer through the second contact hole.

It is preferable that the steps (j), (k) and (l) are carried out simultaneously with the steps (g), (h) and (i), respectively.

It is preferable that the second electrically conductive layer is formed in the step (d) so that the second electrically conductive layer has the same plane shape as that of the first electrically conductive layer.

As an alternative, the second electrically conductive layer may be formed in the step (d) so that the second electrically conductive layer is smaller in plane shape than the first electrically conductive layer.

The method may further include the step of planarizing the second insulating film.

It is preferable that the method further includes the steps of (m) forming a third contact hole through the second insulating film outside the second electrically conductive layer to reach the first electrically conductive layer, (n) filling the third contact hole with metal, and (o) forming the first wiring layer on the second insulating film in such a manner that the first wiring layer makes contact with the first electrically conductive layer through the third contact hole.

It is preferable that the steps (m), (n) and (o) are carried out simultaneously with the steps (g), (h) and (i), respectively.

It is preferable that the first and second wiring layers are formed in the form of a comb in the steps (i) and (l) so that combs of the first and second wiring layers are in mesh with each other.

As an alternative, the first and second wiring layers may be formed in zigzag in the steps (i) and (l) so that the first and second wiring layers face each other.

The advantages obtained by the aforementioned present invention will be described hereinbelow.

In accordance with the present invention, since the first contact hole is formed throughout the second insulating film, the second electrically conductive layer and the dielectric layer to reach the first electrically conductive layer, and the second contact hole is formed only throughout the second insulating film. The first wiring layer makes electrical contact with the first electrically conductive layer through the first contact hole, and the second wiring layer makes electrical contact with the second electrically conductive layer through the second contact hole. Hence, the first contact hole can be formed together with the second contact hole, which minimizes an increase in a dimension of a capacity, and also minimizes a parasitic resistance of a lower electrode regardless of a shape of an area over which the first and second electrically conductive layers overlap each other, and hence, improves a high frequency characteristic of a capacity.

In particular, the present invention is more useful for a semiconductor device having a greater area over which the first and second electrically conductive layers overlap each other.

The above and other objects and advantageous features of the present invention will be made apparent from the following description made with reference to the accompanying drawings, in which like reference characters designate the same or similar parts throughout the drawings.

DESCRIPTION OF THE PREFERRED
EMBODIMENTS

[First Embodiment]

Figure 3A:
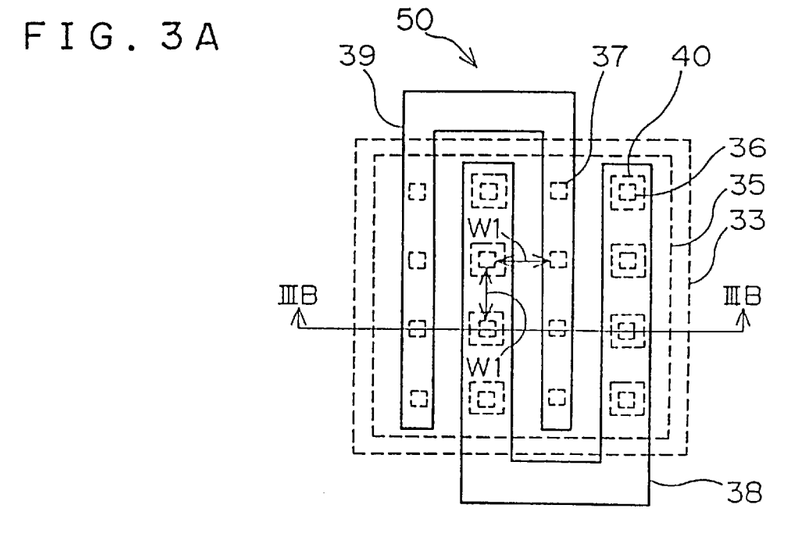
FIG. 3A is a plan view of a semiconductor device in accordance with the first embodiment.
Figure 3B:
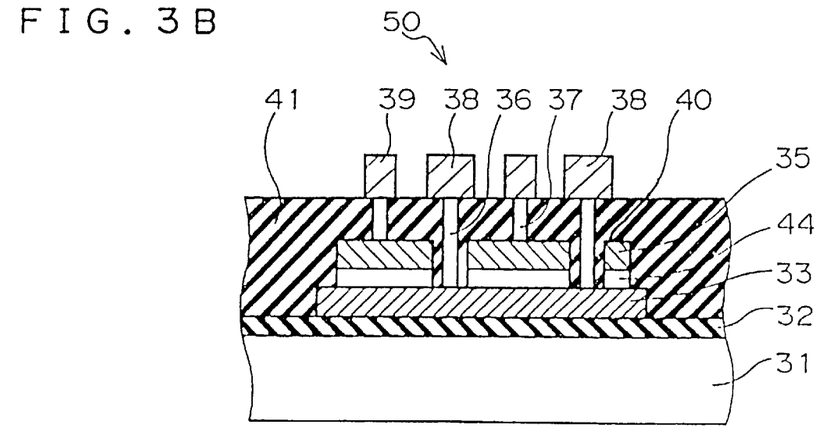
FIG. 3B is a cross-sectional view taken along the line IIIB—IIIB in FIG. 3A.

FIGS. 3A and 3B illustrate a semiconductor device in accordance with the first embodiment.

With reference to FIG. 3B, the semiconductor device 50 is comprised of a silicon substrate 31, a first insulating film 32 formed on the silicon substrate 31, a first electrically conductive layer or first electrode 33 formed on the first insulating film 32, a dielectric layer 34 formed on the first electrically conductive layer 33, a second electrically conductive layer or second electrode 35 formed on the dielectric layer 34, a second insulating film 41 covering the first insulating film 32, the first electrically conductive layer 33, the dielectric film 34, and the second electrically conductive layer 35 therewith, a first wiring layer 38 formed on the second insulating film 41, and a second wiring layer 39 formed on the second insulating film 41.

The dielectric layer 34 is formed with a first through-hole, and the second electrically conductive layer 35 is formed with a second through-hole in alignment with the first through-hole. Hence, the first and second through-holes cooperate with each other to thereby define a through-hole 40 passing through the second electrically conductive layer 35 and the dielectric layer 34.

A first contact hole 36 is formed through the second insulating film 41, and the second electrically conductive layer 35 and the dielectric layer 34 both in the through-hole 40, to reach the first electrically conductive layer 33. A second contact hole 37 is formed through the second insulating film 41 to reach the second electrically conductive layer 35.

Both the first and second contact holes 36 and 37 are filled with electrically conductive material such as metal.

The first wiring layer 38 makes electrical contact with the first electrically conductive layer 33 through the first contact hole 36. The second wiring layer 39 makes electrical contact with the second electrically conductive layer 35 through the second contact hole 37.

In the first embodiment, the second electrically conductive layer 35 is designed to be smaller in size than the first electrically conductive layer 33.

As illustrated in FIG. 3A, both the first and second wiring layers 38 and 39 are in the form of a comb, and are arranged in such a manner that combs of the first and second wiring layers 38 and 39 are in mesh with each other.

Hereinbelow is explained a method of fabricating the above-mentioned semiconductor device 50 in accordance with the first embodiment.

First, a silicon dioxide film as the first insulating film 32 is formed on the silicon substrate 31.

Then, a polysilicon film is deposited over the silicon dioxide film 32 by a thickness in the range of 150 to 300 nm. Then, the polysilicon film is ion-implanted at a dose of about $1\times10^{20}$ cm$^{-3}$ arsenic (As) to thereby have a sheet resistance in the range of 50 to 100 Ω per a unit area. Then, the polysilicon film is patterned into a desired pattern. Thus, there is formed the first electrically conductive film or lower electrode 33 on the silicon dioxide film 32.

Then, a silicon dioxide film is deposited all over the first electrically conductive film 33 by a thickness in the range of 10 to 40 nm by chemical vapor deposition (CVD).

The silicon dioxide film is patterned so that the patterned silicon dioxide film is smaller in size than the first electrically conductive film 33. Thus, there is formed the dielectric film 34 on the first electrically conductive film 33.

Then, a polysilicon film is deposited over the silicon dioxide film 34 by a thickness in the range of 150 to 300 nm. Then, the polysilicon film is ion-implanted at a dose of about $1\times10^{20}$ cm$^{-3}$ arsenic (As) to thereby have a sheet resistance in the range of 50 to 100 Ω per a unit area. Then, the polysilicon film is patterned into such a pattern that the patterned polysilicon film has the same plane shape or outer periphery as that of the underlying silicon dioxide film 34. Namely, when the polysilicon film is patterned, a portion of the silicon dioxide film 34, corresponding to a portion of the polysilicon film which will make the second electrically conductive film 35, is removed. Thus, there is formed the second electrically conductive film or upper electrode 35 on the silicon dioxide film 34.

Then, the through-hole 40 is formed throughout the second electrically conductive film 35 and the silicon dioxide film 34 to reach the first electrically conductive film 33.

As an alternative, the polysilicon film 35 may be patterned into such a pattern that there is formed the second through-hole, and then, the first through-hole may be formed in the silicon dioxide film 34 in alignment with the second through-hole. Thus, there is formed the through-hole 40.

Then, a product resulting from the previous step is covered with a second insulating film 41 so that the thorough-hole 40 is filled with the second insulating film 41.

A portion of the second insulating film 41 between the second electrically conductive film 35 and later mentioned first and second wiring layers has a thickness in the range of about 500 to about 1000 nm. The second insulating film 41 is planarized by chemical mechanical polishing (CMP).

Then, there is formed a first contact hole 36 reaching the first electrically conductive film 33 through the through-hole 40. There is also formed a second contact hole 37 reaching the second electrically conductive film 35. The first and second contact holes 36 and 37 may be simultaneously formed, or may be separately formed.

It is necessary for the first contact hole 36 not to make direct contact with the second electrically conductive film 35. Hence, the through-hole 40 is designed to have an inner wall spaced away from the first contact hole 36 by about 0.5 μm.

Then, the first and second contact holes 36 and 37 are filled with electrically conductive material such as metal. In the instant embodiment, the first and second contact holes 36 and 37 are filled with aluminum.

Then, the first wiring layer 38 is formed on the second insulating film 41 in such a manner that the first wiring layer 38 makes electrical contact with the first electrically conductive layer 33 through the first contact hole 36, and the second wiring layer 39 is also formed on the second insulating film 41 in such a manner that the second wiring layer 39 makes electrical contact with the second electrically conductive layer 35 through the second contact hole 37.

Thus, there is completed a capacity.

In the instant embodiment, the second electrically conductive layer 35 is designed to have a 20 μm×20 μm square transverse cross-section, the through-hole 40 is designed to have a 1.5 μm×1.5 μm square transverse cross-section, and the first and second contact holes 36 and 37 are designed to have a 0.5 μm×0.5 μm square transverse cross-section.

As illustrated in FIG. 3A, the first and second contact holes 36 and 37 are formed both by eight. The first contact holes 36 are spaced away from each other by a pitch W1, and the second contact holes 37 are spaced away from each other also by a pitch W1. Each of the first contact holes 36 is spaced away from the adjacent second contact hole 37 by a pitch W1. In the instant embodiment, the pitch W1 is set equal to 10 μm.

In the instant embodiment, the resultant capacity is formed to be a 22 μm×22 μm square, and hence, has an area of 484 μm$^2$, which is smaller than an area of the conventional capacity illustrated in FIGS. 2A to 2C by 20% or greater.

An area of the second electrically conductive layer or upper electrode 35 is equal to 400 μm$^2$, and a total area of the eight through-holes 40 is 18 μm$^2$. Hence, an area over which the upper and lower electrodes 35 and 33 overlap each other is equal to 382 μm$^2$ (400−18=382), which is about 5% smaller than the same of the conventional capacity illustrated in FIGS. 2A to 2C.

In addition, whereas a maximum spacing between adjacent contact holes is 20 μm or greater in the conventional capacity illustrated in FIGS. 2A to 2C, the same is 10 μm in the first embodiment, which is equal to half or smaller than a maximum spacing in the conventional capacity. This ensures significant reduction in a parasitic resistance.

[Second Embodiment]

Figure 4A:
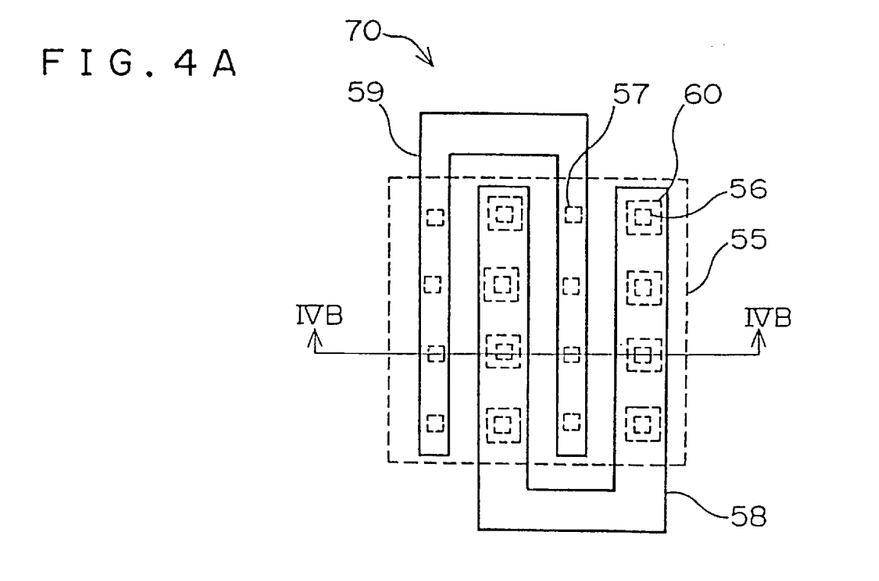
FIG. 4A is a plan view of a semiconductor device in accordance with the second embodiment.
Figure 4B:
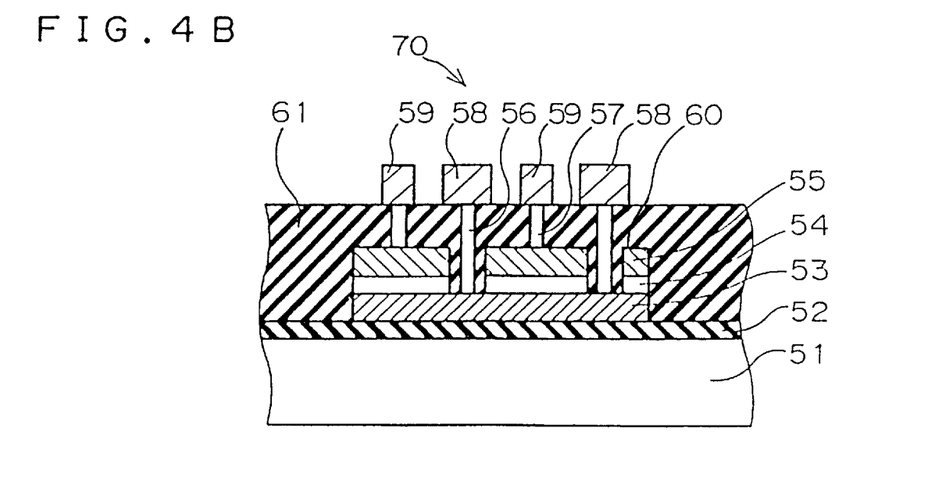
FIG. 4B is a cross-sectional view taken along the line IVB—IVB in FIG. 4A.

FIGS. 4A and 4B illustrate a semiconductor device in accordance with the second embodiment.

With reference to FIG. 4B, the semiconductor device 70 is comprised of a silicon substrate 51, a first insulating film 52 formed on the silicon substrate 51, a first electrically conductive layer or first electrode 53 formed on the first insulating film 52, a dielectric layer 54 formed on the first electrically conductive layer 53, a second electrically conductive layer or second electrode 55 formed on the dielectric layer 54, a second insulating film 61 covering the first insulating film 52, the first electrically conductive layer 53, the dielectric film 54, and the second electrically conductive layer 55 therewith, a first wiring layer 58 formed on the second insulating film 61, and a second wiring layer 59 formed on the second insulating film 61.

The dielectric layer 54 is formed with a first through-hole, and the second electrically conductive layer 55 is formed with a second through-hole in alignment with the first through-hole. Hence, the first and second through-holes cooperate with each other to thereby define a through-hole 60 passing through the second electrically conductive layer 55 and the dielectric layer 54.

A first contact hole 56 is formed through the second insulating film 61, and the second electrically conductive layer 55 and the dielectric layer 54 both in the through-hole 60, to reach the first electrically conductive layer 53. A second contact hole 57 is formed through the second insulating film 61 to reach the second electrically conductive layer 55.

Both the first and second contact holes 56 and 57 are filled with electrically conductive material such as metal.

The first wiring layer 58 makes electrical contact with the first electrically conductive layer 53 through the first contact hole 56. The second wiring layer 59 makes electrical contact with the second electrically conductive layer 55 through the second contact hole 57.

In the second embodiment, the second electrically conductive layer 55 is designed to be equal in size to the first electrically conductive layer 53 unlike the first embodiment.

As a result, the capacity in accordance with the second embodiment has an area of 400 $\mu m^2$ which is about 18% smaller than an area of the capacity in accordance with the first embodiment, that is 484 $\mu m^2$.

As illustrated in FIG. 4A, both the first and second wiring layers 58 and 59 are in the form of a comb, and are arranged in such a manner that combs of the first and second wiring layers 58 and 59 are in mesh with each other.

A method of fabricating the above-mentioned semiconductor device 70 in accordance with the second embodiment is the same as the method of fabricating the semiconductor device 50 in accordance with the first embodiment except that the second electrically conductive layer or upper electrode 55 is formed to be equal in size to the first electrically conductive layer or lower electrode 53.

[Third Embodiment]

Figure 5A:
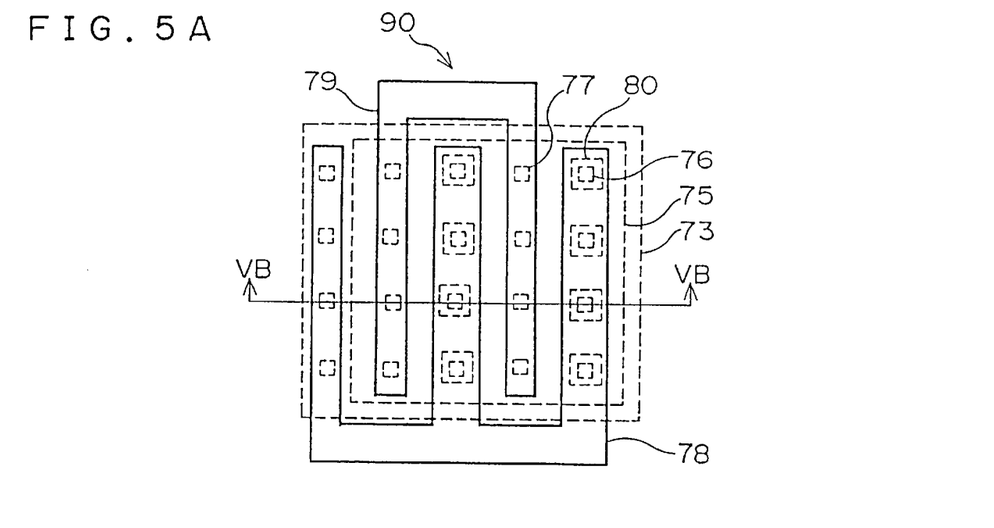
FIG. 5A is a plan view of a semiconductor device in accordance with the third embodiment.
Figure 5B:
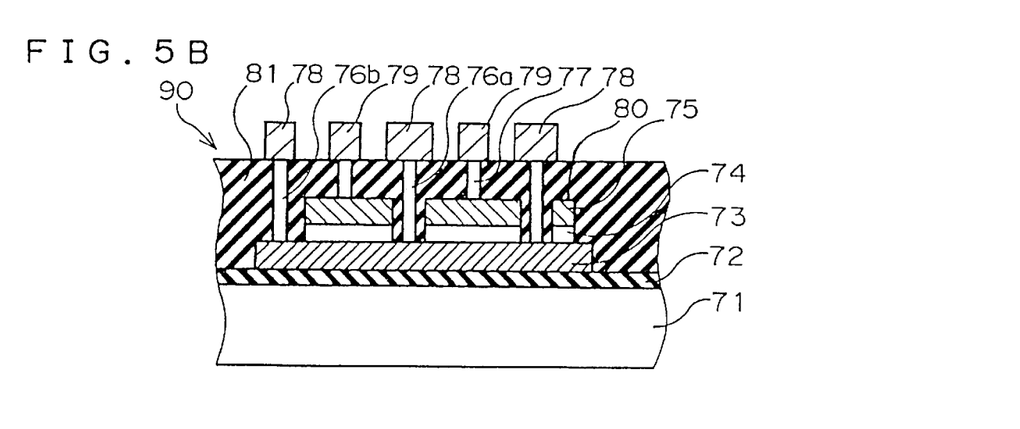
FIG. 5B is a cross-sectional view taken along the line VB—VB in FIG. 5A.

FIGS. 5A and 5B illustrate a semiconductor device in accordance with the third embodiment.

With reference to FIG. 5B, the semiconductor device 90 is comprised of a silicon substrate 71, a first insulating film 72 formed on the silicon substrate 71, a first electrically conductive layer or first electrode 73 formed on the first insulating film 72, a dielectric layer 74 formed on the first electrically conductive layer 73, a second electrically conductive layer or second electrode 75 formed on the dielectric layer 74, a second insulating film 81 covering the first insulating film 72, the first electrically conductive layer 73, the dielectric film 74, and the second electrically conductive layer 75 therewith, a first wiring layer 78 formed on the second insulating film 81, and a second wiring layer 79 formed on the second insulating film 81.

Similarly to the first and second embodiments, there is formed a through-hole 80 passing through the second electrically conductive layer 75 and the dielectric layer 74.

A first contact hole 76a is formed through the second insulating film 81 and the through-hole 80, to reach the first electrically conductive layer 73. A second contact hole 77 is formed through the second insulating film 81 to reach the second electrically conductive layer 75. A third contact hole 76b is formed through the second insulating film 81 to reach the first electrically conductive layer 73.

All the first to third contact holes 76a, 77 and 76b are filled with electrically conductive material such as metal.

The first wiring layer 78 makes electrical contact with the first electrically conductive layer 73 through the first contact hole 76a and the third contact hole 76b. The second wiring layer 79 makes electrical contact with the second electrically conductive layer 75 through the second contact hole 77.

In the third embodiment, the second electrically conductive layer 75 is designed to be smaller in size than the first electrically conductive layer 73 so that there can be formed the third contact hole 76b outside the second electrically conductive layer 75.

As illustrated in FIG. 5A, both the first and second wiring layers 78 and 79 are in the form of a comb, and are arranged in such a manner that combs of the first and second wiring layers 78 and 79 are in mesh with each other, similarly to the first and second embodiments.

A method of fabricating the above-mentioned semiconductor device 90 in accordance with the third embodiment is the same as the method of fabricating the semiconductor device 50 in accordance with the first embodiment except that the method further has the step of forming the third contact hole 76b. The third contact hole 76b may be formed simultaneously with the first and/or second contact holes 76a and 77, or may be formed separately from the first and/or second contact holes 76a and 77.

Though an area over which the first and second electrically conductive layers 73 and 75 overlap each other is designed to be a square in the third embodiment, the area is not to be limited to a square in shape. The area may be designed to have any shape such as a circle, semicircle, triangle, polygon, and a combination thereof.

[Fourth Embodiment]

Figure 6:
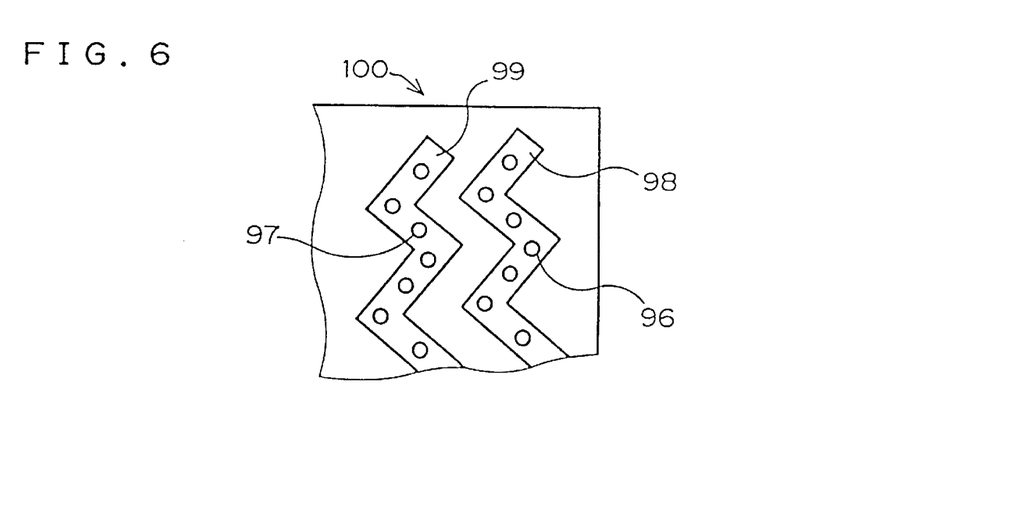
FIG. 6 is a plane view of a semiconductor device in accordance with the fourth embodiment.

FIG. 6 is a plane view of a semiconductor device in accordance with the fourth embodiment.

In the above-mentioned first to third embodiments, the first wiring layer 38, 58, 78 and the second wiring layer 39, 59, 79 are both designed to be a comb in shape. However, as illustrated in FIG. 6, a semiconductor device 100 in accordance with the fourth embodiment includes the first and second wiring layers 98 and 99 designed to be zigzag-shaped in parallel. First and second contact holes 96 and 97 are formed below the first and second contact holes 96 and 97, respectively.

The fourth embodiment provides the same advantage as the advantage obtained by the above-mentioned first to third embodiments that it is possible to reduce an area over which the first and second electrically conductive layers overlap each other.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-142456 filed on May 25, 1998 including specification, claims, drawings and summary is incorporated herein by reference in its entirety.

What is claimed is:

1. A semiconductor device comprising:
   (a) a substrate;
   (b) a first insulating film formed on said substrate;
   (c) a first electrically conductive layer formed on said first insulating film;
   (d) a dielectric layer formed on said first electrically conductive layer, said dielectric layer being formed with a first through-hole;
   (e) a second electrically conductive layer formed on said dielectric layer, said second electrically conductive layer being formed with a second through-hole in alignment with said first through-hole;
   (f) a second insulating film covering said first and second electrically conductive layers therewith; and
   (g) a first wiring layer formed on said second insulating film,
      a first contact hole being formed through said second insulating film, and said dielectric layer and said second electrically conductive layer both in said first and second through-holes,
      said first wiring layer making electrical contact with said first electrically conductive layer through said first contact hole.

2. The semiconductor device as set forth in claim 1, further comprising a second wiring layer formed on said second insulating film, said second wiring layer making electrical contact with said second electrically conductive layer through a second contact hole formed through said second insulating film.

3. The semiconductor device as set forth in claim 1, wherein said first and second electrically conductive layers have the same plane shape.

4. The semiconductor device as set forth in claim 1, wherein said second electrically conductive layer is smaller in plane shape than said first electrically conductive layer.

5. The semiconductor device as set forth in claim 1, wherein said first wiring layer making electrical contact with said first electrically conductive layer further through a third contact hole formed through said second insulating film outside said second electrically conductive layer.

6. The semiconductor device as set forth in claim 1, wherein said first and second wiring layers are in the form of a comb, and are arranged in such a manner that combs of said first and second wiring layers are in mesh with each other.

7. The semiconductor device as set forth in claim 1, wherein said first and second wiring layers are formed in zigzag.

8. The semiconductor device as set forth in claim 1, wherein said second insulating film has a thickness in the range of 500 to 1000 nm above said second electrically conductive layer.

9. The semiconductor device as set forth in claim 1, wherein said first and second through-holes have a common diameter.

10. A method of fabricating a semiconductor device as claimed in claim 1, comprising the steps of:

(a) forming a first insulating film formed on a substrate;

(b) forming a first electrically conductive layer formed on said first insulating film;

(c) forming a dielectric layer formed on said first electrically conductive layer;

(d) forming a second electrically conductive layer formed on said dielectric layer;

(e) forming a through-hole throughout both said second electrically conductive layer and said dielectric layer;

(f) forming a second insulating film covering therewith a product resulting from said step (e);

(g) forming a first contact hole through said second insulating film, and said dielectric layer and said second electrically conductive layer both in said through-hole, to reach said first electrically conductive layer;

(h) filling said first contact hole with metal; and (i) forming a first wiring layer on said second insulating film in such a manner that said first wiring layer makes electrical contact with said first electrically conductive layer through said first contact hole.

11. The semiconductor device as set forth in claim 9, wherein said first and second through-holes have an inner wall spaced away from said first contact hole by about 0.5 $\mu$m.

12. The method as set forth in claim 11, further comprising the steps of:

(j) forming a second contact hole through said second insulating film to reach said second electrically conductive layer;

(k) filling said second contact hole with metal; and (l) forming a second wiring layer on said second insulating film in such a manner that said second wiring layer makes electrical contact with said second electrically conductive layer through said second contact hole.

13. The method as set forth in claim 10, wherein said second electrically conductive layer is formed in said step (d) so that said second electrically conductive layer has the same plane shape as that of said first electrically conductive layer.

14. The method as set forth in claim 10, wherein said second electrically conductive layer is formed in said step (d) so that said second electrically conductive layer is smaller in plane shape than said first electrically conductive layer.

15. The method as set forth in claim 10, further comprising the step of planarizing said second insulating film.

16. The method as set forth in claim 10, further comprising the steps of:

(m) forming a third contact hole through said second insulating film outside said second electrically conductive layer to reach said first electrically conductive layer;

(n) filling said third contact hole with metal; and (o) forming said first wiring layer on said second insulating film in such a manner that said first wiring layer makes contact with said first electrically conductive layer through said third contact hole.

17. The method as set forth in claim 12, wherein said step (j) is carried out simultaneously with said step (g).

18. The method as set forth in claim 12, wherein said step (k) is carried out simultaneously with said step (h).

19. The method as set forth in claim 12, wherein said step (l) is carried out simultaneously with said step (i).

20. The method as set forth in claim 12, wherein said first and second wiring layers are formed in the form of a comb in said steps (i) and (l) so that combs of said first and second wiring layers are in mesh with each other.

21. The method as set forth in claim 12, wherein said first and second wiring layers are formed in zigzag in said steps (i) and (l) so that said first and second wiring layers face each other.

22. The method as set forth in claim 16, wherein said step (m) is carried out simultaneously with said step (g).

23. The method as set forth in claim 16, wherein said step (n) is carried out simultaneously with said step (h).

24. The method as set forth in claim 16, wherein said step (o) is carried out simultaneously with said step (i).

* * * * *